US010338528B2

(12) United States Patent
Kohler et al.

(10) Patent No.: US 10,338,528 B2
(45) Date of Patent: Jul. 2, 2019

(54) METHOD FOR FABRICATION OF A BALANCE SPRING OF A PREDETERMINED STIFFNESS BY LOCAL REMOVAL OF MATERIAL

(71) Applicant: CSEM Centre Suisse d'Electronique et de Microtechnique SA—Recherche et developpement, Neuchatel (CH)

(72) Inventors: Frederic Kohler, Avry-sur-Matran (CH); Jean-Luc Bucaille, Presilly (FR); Olivier Hunziker, Vevey (CH)

(73) Assignee: CSEM Centre Suisse d'Electronique et de Microtechnique SA—Recherche et developpement, Neuchatel (CH)

( * ) Notice: Subject to any disclaimer, the term of this patent is extended or adjusted under 35 U.S.C. 154(b) by 66 days.

(21) Appl. No.: 15/355,648

(22) Filed: Nov. 18, 2016

(65) Prior Publication Data
US 2017/0176941 A1    Jun. 22, 2017

(30) Foreign Application Priority Data

Dec. 18, 2015   (EP) .................................... 15201341

(51) Int. Cl.
*G04B 17/06*   (2006.01)
*F16F 1/10*    (2006.01)
*G04D 7/08*    (2006.01)
*G04D 7/10*    (2006.01)
*B81C 1/00*    (2006.01)
*G04B 17/22*   (2006.01)

(52) U.S. Cl.
CPC .............. *G04B 17/066* (2013.01); *B81C 1/00* (2013.01); *F16F 1/10* (2013.01); *G04B 17/22* (2013.01); *G04D 7/082* (2013.01); *G04D 7/10* (2013.01)

(58) Field of Classification Search
CPC ................................ G04B 17/066; G04D 7/10
See application file for complete search history.

(56) References Cited

U.S. PATENT DOCUMENTS

2005/0281137 A1* 12/2005 Bourgeois .............. F16F 1/021
368/175
2012/0048035 A1* 3/2012 Cerutti ..................... G04D 7/08
73/862.321
(Continued)

FOREIGN PATENT DOCUMENTS

CH        709 516 A2    10/2015
EP      1 213 628 A1     6/2002
(Continued)

OTHER PUBLICATIONS

European Search Report dated May 24, 2016 in European Application 15201341.3, filed on Dec. 18, 2015 (with English Translation of Categories of cited documents & Written Opinion).

Primary Examiner — Moshe Wilensky
(74) Attorney, Agent, or Firm — Oblon, McClelland, Maier & Neustadt, L.L.P.

(57) ABSTRACT

The invention relates to a method for fabrication of a balance spring of a predetermined stiffness comprising the steps of fabricating a balance spring in dimensions of increased thickness, determining the stiffness of the balance spring formed in step a) in order to remove, locally, a volume of material, in order to obtain the balance spring having the dimensions necessary for said predetermined stiffness.

29 Claims, 6 Drawing Sheets

(56) References Cited

U.S. PATENT DOCUMENTS

| | | |
|---|---|---|
| 2013/0272100 A1 | 10/2013 | Klinger et al. |
| 2013/0308430 A1 | 11/2013 | Verardo et al. |
| 2015/0261187 A1* | 9/2015 | Hessler .................. G04B 17/06 368/170 |
| 2016/0238994 A1* | 8/2016 | Ching .................. G04B 17/066 |
| 2016/0370763 A1* | 12/2016 | Cusin ..................... G04B 17/34 |

FOREIGN PATENT DOCUMENTS

| | | |
|---|---|---|
| EP | 2 455 825 A1 | 5/2012 |
| WO | WO 2012/007460 A1 | 1/2012 |

* cited by examiner

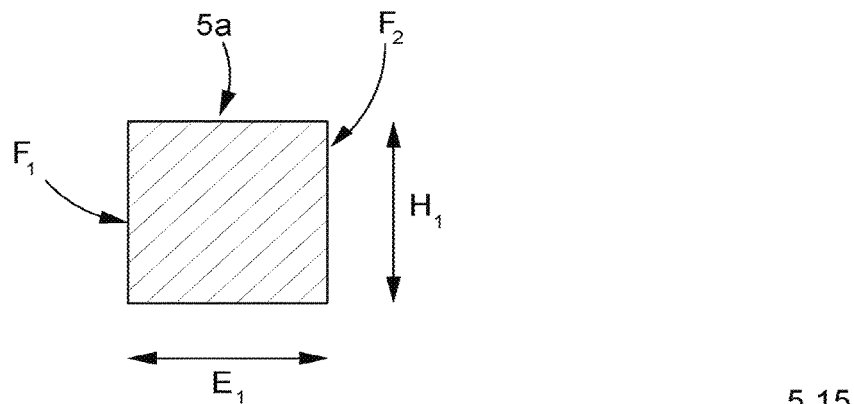
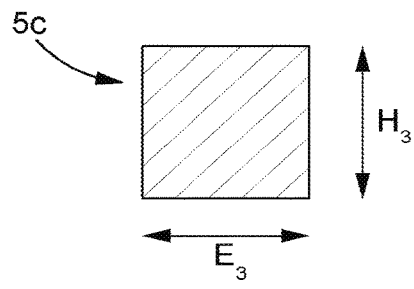
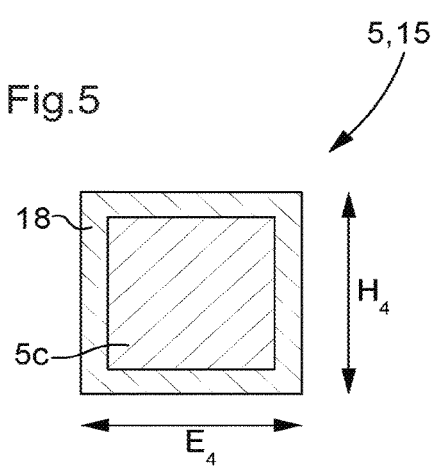
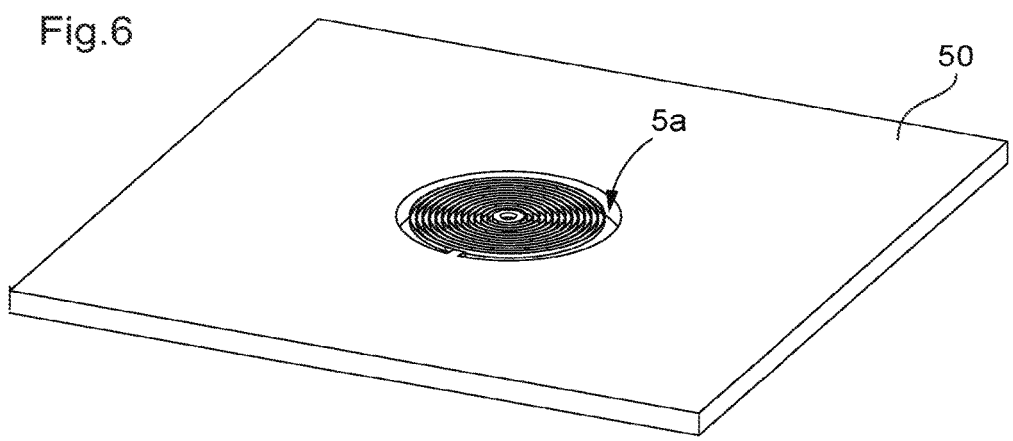

Fig.8
Fig.9
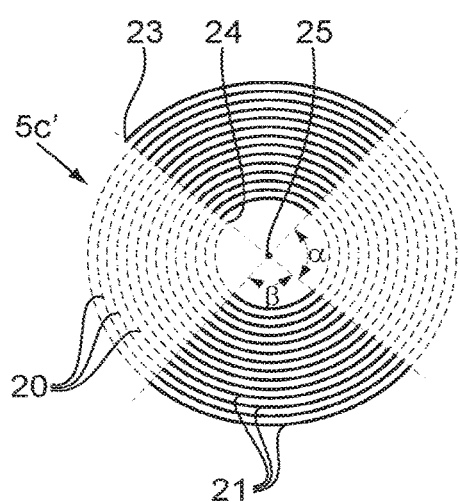
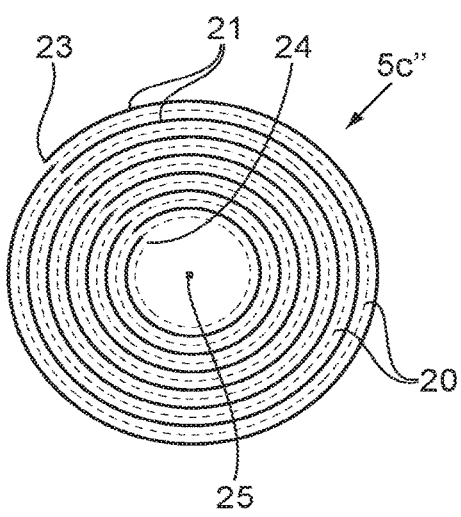
Fig.10
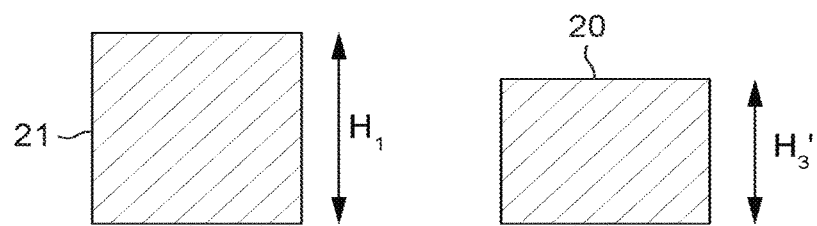

METHOD FOR FABRICATION OF A BALANCE SPRING OF A PREDETERMINED STIFFNESS BY LOCAL REMOVAL OF MATERIAL

This application claims priority from European Patent Application No 15201341.3 of Dec. 18, 2015, the entire disclosure of which is hereby incorporated herein by reference.

FIELD OF THE INVENTION

The invention relates to a method for fabrication of a balance spring of a predetermined stiffness and, more specifically, such a balance spring used as a compensating balance spring cooperating with a balance of predetermined inertia to form a resonator having a predetermined frequency.

BACKGROUND OF THE INVENTION

It is explained in EP Patent 1422436, incorporated in the present application by reference, how to form a compensating balance spring comprising a silicon core coated with silicon dioxide and cooperating with a balance having a predetermined inertia for thermal compensation of said entire resonator.

The fabrication of such a compensating balance spring offers numerous advantages but also has drawbacks. Indeed, the step of etching several balance springs in a silicon wafer offers a significant geometric dispersion between the balance springs of the same wafer and a greater dispersion between the balance springs of two wafers etched at different times. Incidentally, the stiffness of each balance spring etched with the same etch pattern is variable, creating significant fabrication dispersions.

SUMMARY OF THE INVENTION

It is an object of the present invention to overcome all of part of the aforecited drawbacks by proposing a method for fabrication of a balance spring whose dimensions are sufficiently precise not to require further operations?.

The invention therefore relates to a method for fabrication of a balance spring of a predetermined stiffness including the following steps:
a) forming a balance spring in dimensions greater than the dimensions necessary to obtain said balance spring of a predetermined stiffness;
b) determining the stiffness of the balance spring formed in step a) by measuring the frequency of said balance spring coupled with a balance having a predetermined inertia;
c) calculating the thickness of material to be removed, based on the determination of the balance spring stiffness determined in step b), to obtain the dimensions necessary to obtain said balance spring of a predetermined stiffness;
d) removing from the balance spring formed in step a) said thickness of material to obtain the balance spring having the dimensions necessary for said predetermined stiffness, said thickness of material being removed in a non-homogeneous manner along the balance spring.

It is thus understood that the method can guarantee very high dimensional precision of the balance spring, and incidentally, a more precise stiffness of said balance spring. Any fabrication parameter able to cause geometric variations in step a) can thus be completely rectified for each fabricated balance spring, or rectified on average for all the balance springs formed on the same wafer, thereby drastically reducing the scrap rate. Further, the non-homogeneous nature of the removal of material performed in step d) can give the balance spring additional advantages, particularly in terms of simplicity of fabrication.

In accordance with other advantageous variants of the invention:
in step a), the dimensions of the balance spring formed in step a) are between 1% and 20% greater than those necessary to obtain said balance spring of said predetermined stiffness;
step a) is achieved by means of deep reactive ion etching or chemical etching;
in step a), several balance springs are formed in the same wafer in dimensions greater than the dimensions necessary to obtain several balance spring of a predetermined stiffness or several balance springs of several predetermined stiffnesses;
the balance spring formed in step a) is based on silicon, glass, ceramic, metal or metal alloy;
step b) comprises phase b1): measuring the frequency of an assembly comprising the balance spring formed in step a) coupled with a balance having a predetermined inertia, and phase b2): deducing, from the measured frequency, the stiffness of the balance spring formed in step a);
according to a first variant, step d) comprises phase d1): laser machining the balance spring formed in step a) to obtain the balance spring in the dimensions necessary for said predetermined stiffness;
according to a second variant, step d) comprises phase d1): oxidising the balance spring formed in step a) in order to transform said thickness of silicon-based material to be removed into silicon dioxide and thereby form an oxidised balance spring, and phase d2): removing the oxide from the oxidised balance spring to obtain the balance spring in the dimensions necessary for said predetermined stiffness;
according to a third variant, step d) comprises phase d3): chemical etching of the balance spring formed in step a) to obtain the balance spring in the dimensions necessary for said predetermined stiffness;
after step d), the method performs, at least once more, steps b), c) and d) to further improve the dimensional quality;
after step d), the method also includes step e): forming, on at least one part of said balance spring of a predetermined stiffness, a portion for correcting the stiffness of the balance spring and for forming a balance spring less sensitive to thermal variations;
according to a first variant, step e) comprises phase e1): depositing a layer on one part of the external surface of said balance spring of a predetermined stiffness;
in a second variant, step e) comprises phase e2): modifying the structure, to a predetermined depth, of one part of the external surface of said balance spring of a predetermined stiffness;
according to a third variant, step e) comprises phase e3): modifying the composition, to a predetermined depth, of one part of the external surface of said balance spring of a predetermined stiffness;
in step d), said thickness of material is removed such that said balance spring of a predetermined stiffness produces a difference in rate due to the lack of concentricity of the development of the spring that is equal to or differs by a maximum of ±20% and/or a maximum of ±5 seconds/day, from the corresponding difference in rate produced by the balance spring formed in step a), said differences in rate each being measured at an oscillation amplitude of 150° in comparison to an oscillation amplitude of 330°;

in step d), said thickness of material is removed from first discrete areas of the balance spring formed in step a) and is not removed in second discrete areas which alternate with the first discrete areas along the balance spring;

the first discrete areas have substantially the same angular extension?;

the first discrete areas are arranged substantially regularly along the entire said balance spring formed in step a);

the second discrete areas have substantially the same angular extension?;

the second discrete areas have substantially the same angular extension as the first discrete areas;

the first discrete areas each have an angular extension less than approximately 140° or comprised between approximately 240° and approximately 360°;

in step d), said thickness of material is removed from the thickness, from the height or from the thickness and from the height of the balance spring formed in step a).

BRIEF DESCRIPTION OF THE DRAWINGS

Other features and advantages will appear clearly from the following description, given by way of non-limiting illustration, with reference to the annexed drawings, in which:

FIGS. 3 to 5 are cross-sections of the balance spring in different steps of the method according to the invention.

FIG. 6 is a perspective view of a step of the method according to the invention.

FIGS. 8 and 9 represent two balance springs according to the invention having different non-homogeneous distributions of material.

FIG. 10 represents cross-sections of two discrete areas of one or other of the balance springs illustrated in FIGS. 8 and 9.

DETAILED DESCRIPTION OF PREFERRED EMBODIMENTS

Figure 1:
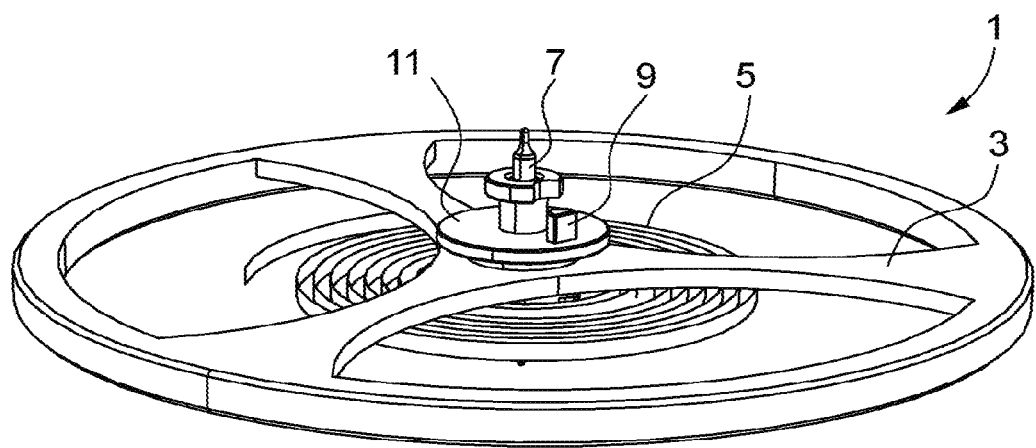
FIG. 1 is a perspective view of an assembled resonator according to the invention.

As illustrated in FIG. 1, the invention relates to a resonator 1 of the type with a balance 3—balance spring 5. Balance 3 and balance spring 5 are preferably mounted on the same arbor 7. In this resonator 1, the moment of inertia/of balance 3 responds to the formula:

$$I = mr^2 \tag{1}$$

where m represents its mass and r the turn radius which also depends on temperature through the expansion coefficient $\alpha_b$ of the balance.

Further, the stiffness C of a balance spring 5 of constant cross-section responds to the formula:

$$C = \frac{Ehe^3}{12L} \tag{2}$$

where E is the Young's modulus of the material used, h the height, e the thickness and L the developed length thereof.

Further, the stiffness C of a balance spring 5 of constant cross-section responds to the formula:

$$C = \frac{E}{12} \frac{1}{\int_0^L \frac{1}{h(l)e^3(l)} dl} \tag{3}$$

where E is the Young's modulus of the material used, h the height, e the thickness and L the developed length and l the curvilinear abscissa along the balance spring.

Further, the stiffness C of a balance spring 5 of variable thickness but constant cross-section responds to the formula:

$$C = \frac{Eh}{12} \frac{1}{\int_0^L \frac{1}{e^3(l)} dl} \tag{4}$$

where E is the Young's modulus of the material used, h the height, e the thickness and L the developed length and l the curvilinear abscissa along the balance spring.

Finally, the elastic constant C of sprung balance resonator 1 answers to the formula:

$$f = \frac{1}{2\pi}\sqrt{\frac{C}{I}} \tag{5}$$

According to the invention, it is desired that a resonator has substantially zero frequency variation with temperature. The frequency variation f with temperature T in the case of a sprung-balance resonator substantially follows the following formula:

$$\frac{\Delta f}{f} = \frac{1}{2}\left\{\frac{\partial E}{\partial T}\frac{1}{E} + 3\cdot\alpha_s - 2\cdot\alpha_b\right\}\cdot\Delta T \tag{6}$$

where:

$\frac{\Delta f}{f}$ is a relative frequency variation;

$\Delta T$ is the temperature variation;

$$\frac{\partial E}{\partial T}\frac{1}{E}$$

is the relative Young's modulus variation with temperature, i.e. the thermoelastic coefficient (TEC) of the balance spring;

$\alpha_s$ is the expansion coefficient of the balance spring, expressed in ppm·° C.$^{-1}$;

$\alpha_b$ is the expansion coefficient of the balance, expressed in ppm·° C.$^{-1}$ Since the oscillations of any resonator intended for a time or frequency base must be maintained, the maintenance system may also contribute to thermal dependence, such as, for example, a Swiss lever escapement (not shown) cooperating with the impulse pin 9 of the roller 11, also mounted on arbor 7.

It is thus clear from formulae (1)-(6) that it is possible to couple balance spring 5 with balance 3 such that the frequency f of resonator 1 is virtually insensitive to temperature variations.

The invention more particularly concerns a resonator 1 wherein the balance spring 5 is used for temperature compensation of the entire resonator 1, i.e. all the parts and particularly the balance 3. Such a balance spring 5 is generally called a temperature compensating balance spring. This is why the invention relates to a method that can guarantee very high dimensional precision of the balance spring, and incidentally, guarantee a more precise stiffness of said balance spring.

According to the invention, compensating balance spring 5, 15 is formed from a material, possibly coated with a thermal compensation layer, and intended to cooperate with a balance 3 having a predetermined inertia. However, there is nothing to prevent the use of a balance with movable inertia-blocks able to offer an adjustment parameter prior to or after the sale of the timepiece.

The utilisation of a material, for example based on silicon, glass or ceramic, for the fabrication of a balance spring 5, 15 offers the advantage of being precise via existing etching methods and of having good mechanical and chemical properties while being virtually insensitive to magnetic fields. It must, however, be coated or surface modified to be able to form a compensating balance spring.

Preferably, the silicon-based material used for the compensating balance spring may be single crystal silicon, regardless of crystal orientation, doped single crystal silicon, regardless of crystal orientation, amorphous silicon, porous silicon, polycrystalline silicon, silicon nitride, silicon carbide, quartz, regardless of crystal orientation, or silicon oxide. Of course, other materials may be envisaged, such as glass, ceramics, cermets, metals or metal alloys. For the sake of simplification, the following explanation will concern a silicon-based material.

Each material type can be surface-modified or coated with a layer to thermally compensate the base material as explained above.

Although the step of etching balance springs in a silicon-based wafer, by means of deep reactive ion etching (DRIE) is the most precise, phenomena which occur during the etch or between two successive etches may nonetheless cause geometric variations.

Of course, other fabrication types may be implemented, such as laser etching, focused ion beam etching (FIB), galvanic growth, growth by chemical vapour deposition or chemical etching, which are less precise and for which the method would be even more meaningful.

Figure 7:
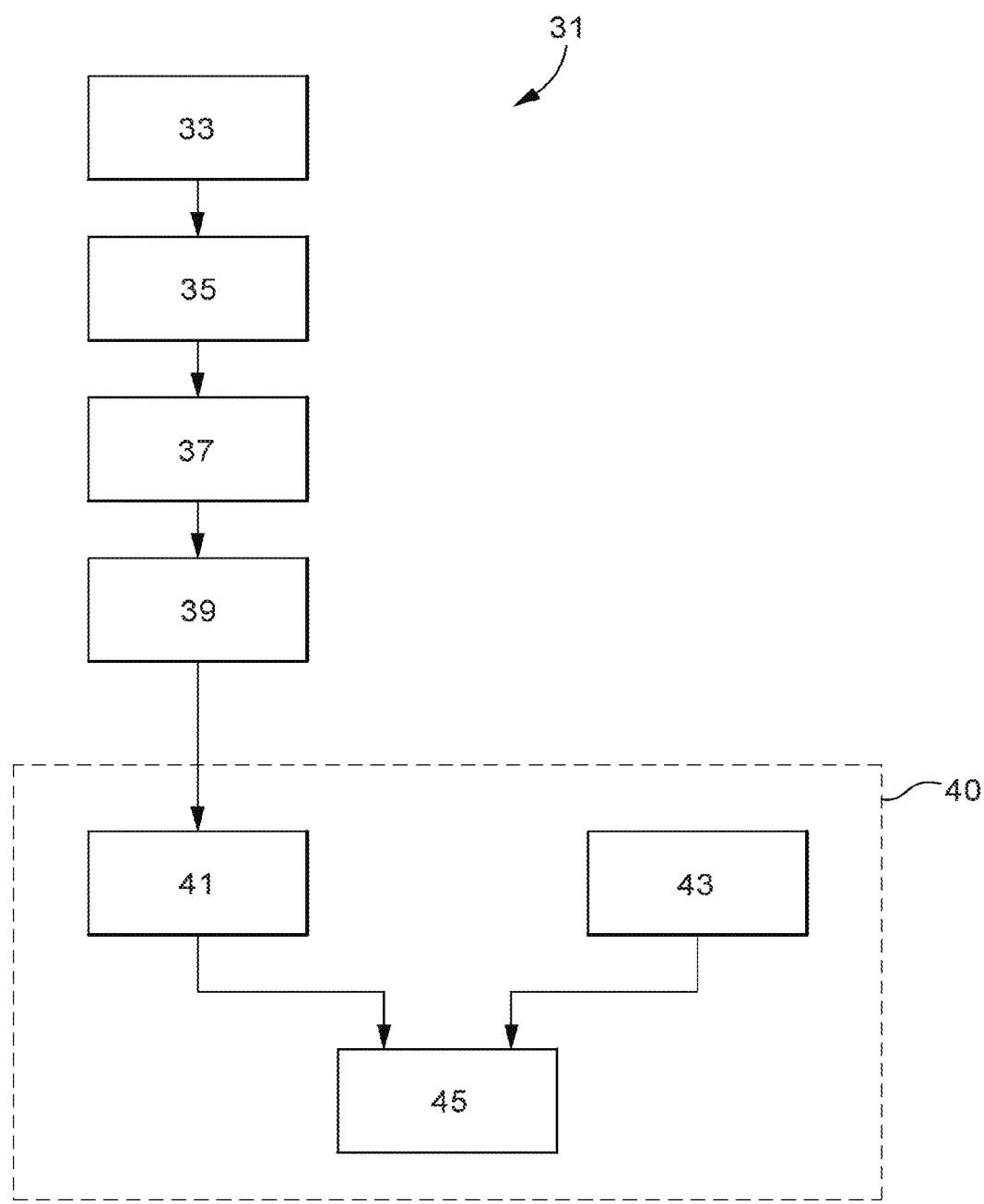
FIG. 7 is a diagram of the method according to the invention.

Thus, the invention relates to a method 31 for fabrication of a balance spring 5c. According to the invention, method 31 comprises, as illustrated in FIG. 7, a first step 33 intended to form at least one balance spring 5a, for example from silicon, in dimensions Da greater than the dimensions Db necessary to obtain said balance spring 5c of a predetermined stiffness C. As seen in FIG. 3, the cross-section of balance spring 5a has a height $H_1$ and a thickness $E_1$.

Preferably, the dimensions Da of balance spring 5a are substantially between 1% and 20% greater than those Db of balance spring 5c necessary to obtain said balance spring 5c of a predetermined stiffness C.

Preferably according to the invention, step 33 is achieved by means of a deep reactive ion etch in a wafer 50 of silicon-based material, as illustrated in FIG. 6. Although this is not represented, the opposite sides $F_1$, $F_2$ are in this case undulating since a Bosch deep reactive ion etch results in an undulating etch, structured by the successive etch and passivation steps.

Of course, the method is not limited to a particular step 33. By way of example, step 33 could also be obtained by means of a chemical etch in a wafer 50, for example of silicon-based material. Further, step 33 means that one or more balance springs are formed, i.e. step 33 can form individual loose balance springs or, alternatively, balance springs formed in a wafer of material.

Consequently, in step 33, several balance springs 5a can be formed in the same wafer 50 in dimensions Da, $H_1$, $E_1$ greater than the dimensions Db, $H_3$, $E_3$ necessary to obtain several balance springs 5c of a predetermined stiffness C or several balance springs 5c of several predetermined stiffnesses C.

Step 33 is also not limited to forming a balance spring 5a in dimensions Da, $H_1$, $E_1$ greater than the dimensions Db, $H_3$, $E_3$ necessary to obtain a balance spring 5c of a predetermined stiffness C, produced using a single material. Thus, step 33 could equally form a balance spring 5a in dimensions Da, $H_1$, $E_1$ greater than the dimensions Db, $H_3$, $E_3$ necessary to obtain a balance spring 5c of a predetermined stiffness C made from a composite material, i.e. comprising several distinct materials.

Method 31 includes a second step 35 intended to determine the stiffness of balance spring 5a. This step 35 may be performed directly on a balance spring 5a still attached to wafer 50 or on a balance spring 5a previously detached from wafer 50, on all, or on a sample of the balance springs still attached to a wafer 50, or on a sample of balance springs previously detached from a wafer 50.

Preferably according to the invention, regardless of whether or not balance spring 5a is detached from wafer 50, step 35 includes a first phase intended to measure the frequency f of an assembly comprising balance spring 5a coupled to a balance having a predetermined inertia I and then, using the relation (5), to deduce therefrom, in a second phase, the stiffness C of balance spring 5a.

This measuring phase may, in particular, be dynamic and performed in accordance with the teaching of EP Patent 2423764, incorporated by reference in the present application. However, alternatively, a static method, performed in accordance with the teaching of EP Patent 2423764, may also be implemented to determine the stiffness C of balance spring 5a.

Of course, as explained above, since the method is not limited to the etching of only one balance spring per wafer, step 35 may also consist in the determination of the mean stiffness of a representative sample, or of all the balance springs formed on the same wafer.

Advantageously according to the invention, based on the determination of the stiffness C of balance spring 5*a*, method 31 includes a step 37 intended to calculate, using relation (2), the thickness of material to be removed from the entire balance spring to obtain the overall dimensions Db necessary to obtain said balance spring 5*c* of a predetermined stiffness C, i.e. the volume of material to be removed from the surface of balance spring 5*a*.

The method continues with a step 39 intended to remove the surplus material from balance spring 5*a* to achieve the dimensions Db necessary to obtain said balance spring 5*c* of a predetermined stiffness C. It is therefore understood that it does not matter whether geometric variations have occurred in the thickness and/or the height of balance spring 5*a* given that, according to equation (2), it is the product $h \cdot e^3$ that determines the stiffness of the coil.

According to the invention, the removal of excess material from balance spring 5*a* is effected in a non-homogeneous manner, i.e. in a manner that varies along balance spring 5*a*. Thus, for example, material can only be removed from balance spring 5*a* in discrete areas or sections of said balance spring, or can be removed along the entire balance spring but more in some areas than others, or can be removed from the thickness $E_1$ in some areas and from the height $H_1$ in other areas. The aforecited dimensions Db, $H_3$, $E_3$ necessary to obtain balance spring 5*a* of a predetermined stiffness C are thus mean dimensions (averaged over the length of the balance spring) of the cross-section of balance spring 5*c*. As represented in FIG. 4, these dimensions Db comprise a mean height $H_3$ and a mean thickness $E_3$. Mean height $H_3$ is less than height $H_1$ of balance spring 5*a*, and/or mean thickness $E_3$ is less than thickness $E_1$ of balance spring 5*a*. As is clear from formula (2), the thickness of material to be removed to obtain predetermined stiffness C is much less if it is removed from thickness $E_1$ of the cross-section of balance spring 5*a* rather than from height $H_1$. However, removal of material from thickness $E_1$ requires greater machining precision.

Removing the excess material in a non-homogeneous manner along balance spring 5*a* in step 39 offers several advantages:
 i) the fabrication of balance spring 5*c* can be faster and less expensive because the removal of material does not need to be performed over the entire balance spring;
 ii) it is possible to limit the removal of material to areas of the balance spring that are more accessible than others, for example the first and/or last coil and/or coils having a greater pitch, to prevent touching or contaminating adjacent coils;
 iii) according to the method used for step 39, removing material over shorter lengths and for a shorter time may promote better control of the method in terms, for example, of the alignment of the machining device or of machining power drift;
 iv) less machining precision is required to obtain the predetermined stiffness C, in particular in the case of removal of material from thickness $E_1$, since the thickness to be removed in selected areas is greater than the thickness that would have to be removed across the entire length of balance spring 5*a* to obtain the same stiffness C;
 v) in the case of a balance spring 5*a* of non-constant cross-section, the removal of material may advantageously be performed in the areas of balance spring 5*a* where the cross-section dimensions are the greatest, to better control the effect of changing stiffness C of the balance spring or conversely in the least stiff areas of balance spring 5*a* to save fabrication time and cost;
 vi) if the removal of material changes the surface state, thereby causing degradation of the mechanical strength or aesthetic appearance, it is possible to choose to remove material only in areas that are subject to less mechanical stress or which are not visible.

In a particular embodiment, the removal of material in step 39 is achieved by means of a laser. However, variants are possible, such as chemical etching or focus beam ion etching, using masks to protect the areas of the balance spring from which it is not desired to remove material. Another variant, in the case of a silicon-based material, may consist in oxidising balance spring 5*a* in determined areas, using masks, in order to transform the thickness of material to be removed into silicon dioxide, and then removing the oxide. Oxidation can be achieved using heat, for example between 800 and 1200° C. in an oxidising atmosphere using water vapour or dioxygen gas. The masks may be made of nitride. The oxide formed on the silicon may be removed by a chemical bath comprising, for example, hydrofluoric acid.

Depending on the arrangement of the areas chosen for removal of material in step 39, the lack of isochronism of the sprung balance resonator due to the development of balance spring 5*c* will or will not change in comparison to balance spring 5*a* formed in step 33. In fact, in operation, depending on the arrangement of said selected areas, the development of balance spring 5*c* will be more or less concentric, generating greater or lesser forces on the balance pivots and on the point of attachment of the balance spring. It is known that a conventional balance spring of constant cross-section develops eccentrically. A balance spring of variable cross-section may, according to the case, develop more concentrically, less concentrically or as concentrically as a balance spring of constant cross-section and therefore respectively improve, worsen or maintain isochronism. In the present invention, it is possible to remove excess material from balance spring 5*a* in step 39 without degrading isochronism and while obtaining at least part of advantages i) to vi) set out above.

To illustrate this advantageous feature of the invention, FIGS. 8 and 9 represent two examples of balance springs 5*c*', 5*c*'' each comprising first discrete areas 20, represented in dotted lines, from which material was removed in step 39. These first discrete areas 20 alternate, along the balance spring, with second discrete areas 21, represented in solid lines, from which no material has been removed. In first discrete areas 20, the height of the balance spring has been reduced from $H_1$=120 µm to $H_3$'=100 µm, for example by laser ablation, whereas in second discrete areas 21 the height of the balance spring has remained unchanged at $H_1$=120 µm (cf. FIG. 10). The coil thickness $E_1$ has not changed along the balance spring. In each of these examples, the mean height $H_3$ of the balance spring, between heights $H_1$ and $H_3$', is that allowing said predetermined stiffness C to be obtained. Preferably, as represented, first discrete areas 20 are regularly distributed along the entire balance spring and have the same angular extension α, measured from the geometric centre of the balance spring, which angular extension α is identical to the angular extension β of second discrete areas 21. It could however be otherwise. In the examples of FIGS. 8 and 9, the angular extension α=β is 90° and 360°, respectively.

Figure 11:
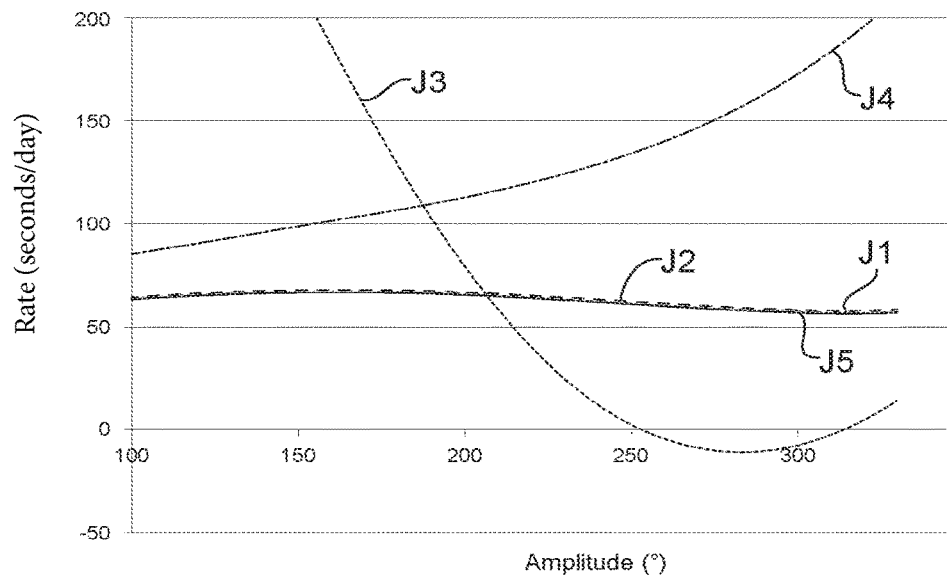
FIG. 11 represents five isochronism curves respectively obtained with five different balance springs.
Figure 12:
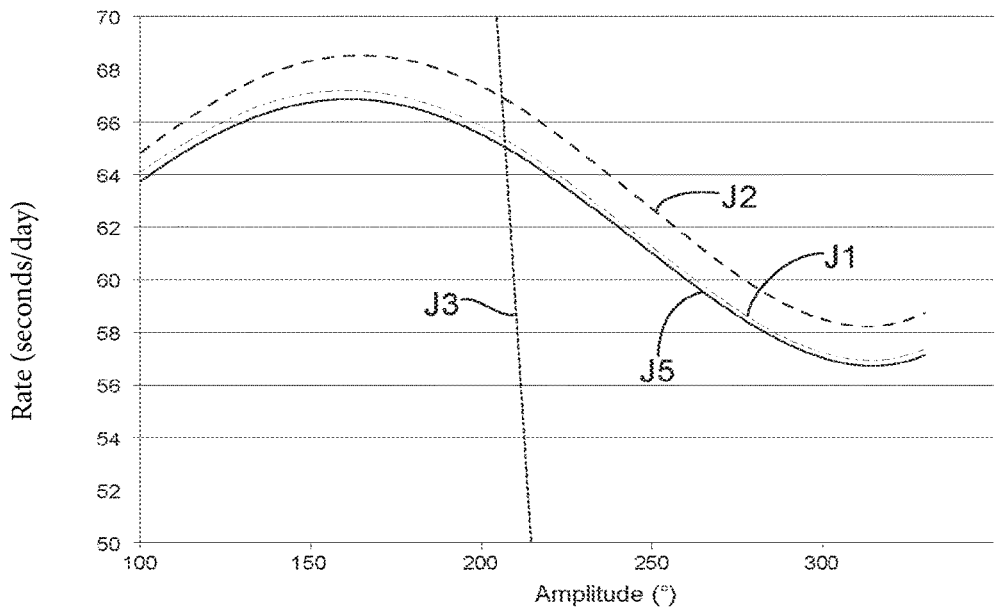
FIG. 12 represents an enlarged scale view of four of the five aforecited isochronism curves.

FIGS. 11 and 12 represent isochronism curves J1 to J5 obtained from different balance springs, namely curve J1 from balance spring 5*c*' illustrated in FIG. 8, curve J2 from balance spring 5c" illustrated in FIG. 9, curve J3 from a balance spring that differs from balance springs 5c' and 5c" in that discrete areas 20, 21 each extend over 180°, curve J4 from a balance spring that differs from balance springs 5c' and 5c" in that discrete areas 20, 21 each extend over 210°, and curve J5 for balance spring 5a of constant cross-section obtained in step 33. These isochronism curves J1 to J5 represent, for each balance spring, the variations in rate of the sprung balance resonator, in seconds/day, as a function of the amplitude of oscillation of the sprung balance resonator, in degrees. Only variations in rate due to the eccentric development of the balance spring are taken into account here, which means that account is not taken of the effects due to the balance or to differences in rate between the different positions of the resonator.

Each curve J1 to J5 is obtained by digital simulation, considering the outer end 23 of the balance spring as fixed and the balance staff to which is attached inner end 24 as free (i.e. not mounted in bearings), calculating using the finite element method? the displacement of the centre of rotation 25 of the balance spring during oscillations of the balance, and then interpolating and integrating the displacement curve as a function of the amplitude of oscillation. Analytical equations relating? the displacement of centre of rotation 25 of the balance spring to rate as a function of the amplitude of oscillation of the balance spring are proposed, for example, in the work entitled "Traité de construction horlogère" by M. Vermot, P. Bovay, D. Prongué and S. Dordor, edited by Presses polytechniques et universitaires romandes, 2011 Any contacts between the coils during the extension and contraction of the balance spring are not taken into account in these simulations, it being possible to prevent such contacts in every case simply by adapting the pitch of the balance spring and/or the spacing of the last coil.

As can be seen in FIGS. 11 and 12, balance springs 5c' and 5c" (curves J1, J2) produce substantially the same variations in rate as balance spring 5a (curve J5). Conversely, the balance springs corresponding to curves J3 and J4 degrade the isochronism of the resonator compared to balance spring 5a, due to a very eccentric development. Similar results would be obtained by changing not the height but the thickness of balance spring 5a.

Figure 13:
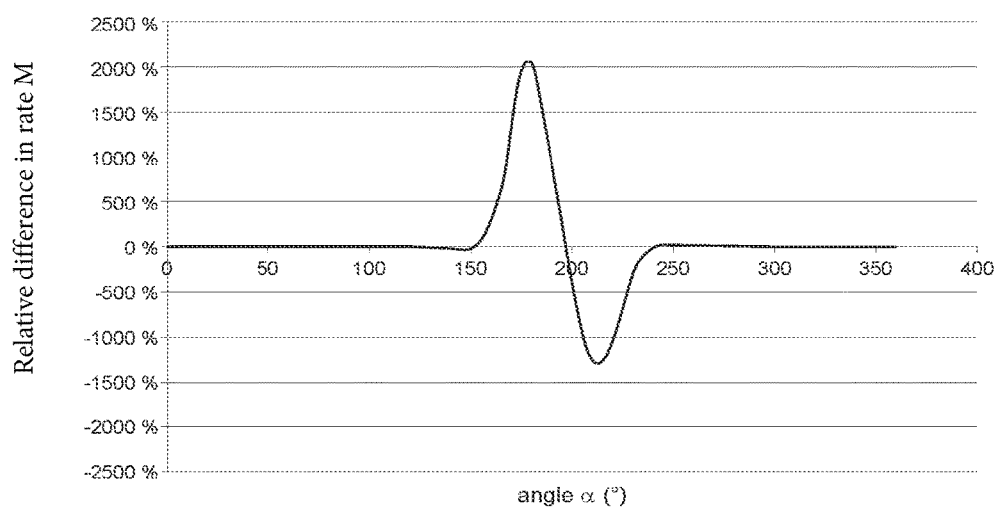
FIG. 13 is a diagram of the relative difference in rate of a balance spring as a function of a non-homogeneous distribution of material over the balance spring.

FIG. 13 represents the relative difference in rate M as a function of angular extension α, in degrees, of each discrete area 20, 21. The "relative difference in rate" means the following magnitude, expressed as a percentage:

$$M = \frac{M_\alpha - M_c}{M_c}$$

where $M_\alpha$ is the difference between the rate at 150° and the rate at 330° for a given balance spring 5c having discrete areas 20, 21 of angular extension α, and $M_c$ is the difference between the rate at 150° and the rate at 330° for the corresponding balance spring 5a of constant cross-section. It can be deduced from this diagram that for angles α comprised between 0° and 140°, or comprised between 240° and 360°, balance spring 5c barely degrades, or does not degrade at all the isochronism of the resonator compared to balance spring 5a; the relative difference in rate M in absolute value is less than 20% and may be less than 10%, or even 5%. The magnitude $M_\alpha - M_c$ in absolute value may be less than 5 seconds/day.

Method 31 may end with step 39. However, after step 39, method 31 may also perform, at least once more, steps 35, 37 and 39 in order to further improve the dimensional quality of the balance spring. These iterations of steps 35, 37 and 39 may, for example, be of particular advantage when the first iteration of steps 35, 37 and 39 is performed on all, or on a sample, of the balance springs still attached to a wafer 50, and then, in a second iteration, on all, or a sample, of the balance springs previously detached from wafer 50 and having undergone the first iteration.

Method 31 may also continue with all or part of process 40 illustrated in FIG. 7, comprising optional steps 41, 43 and 45. Advantageously according to the invention, method 31 may thus continue with step 41 intended to form, on at least one part of balance spring 5c, a portion 18 for forming a balance spring 5, 15 that is less sensitive to thermal variations.

In a first variant, step 41 may consist of a phase e1 intended to deposit a layer on one part of the external surface of said balance spring 5c of a predetermined stiffness C.

In the case where balance spring 5c is made of a silicon-based material, phase e1 may consist in oxidising balance spring 5c to coat it with silicon dioxide in order to form a balance spring that is temperature compensated. This phase e1 may, for example, be obtained by thermal oxidation. This thermal oxidation may, for example, be achieved between 800 and 1200° C. in an oxidising atmosphere with the aid of water vapour or dioxygen gas to form silicon oxide on balance spring 5c.

There is thus obtained the compensating balance spring 5, 15, as illustrated in FIG. 5 which, advantageously according to the invention, comprises a silicon core and a silicon oxide coating 18. Advantageously according to the invention, compensating balance spring 5, 15 therefore has a very high dimensional precision, particularly as regards height H4 and thickness $E_4$, and, incidentally, very fine temperature compensation of the entire resonator 1.

In the case of a silicon-based balance spring, the overall dimensions Db may be found by using the teaching of EP Patent 1422436 and applying it to resonator 1 which is to be fabricated, i.e to compensate for all of the constituent parts of resonator 1, as explained above.

In a second variant, step 41 may consist in a phase e2 intended to modify the structure, to a predetermined depth, of one part of the external surface of said balance spring 5c of a predetermined stiffness C. By way of example, if an amorphous silicon is used, the silicon could be crystallised to a predetermined depth.

In a third variant, step 41 may consist in a phase e3 intended to modify the composition, to a predetermined depth, of one part of the external surface of said balance spring 5c of a predetermined stiffness C. By way of example, if a single crystal or polycrystalline silicon is used, the silicon could be doped or diffused with interstitial or substitutional atoms, to a predetermined depth.

Figure 2:
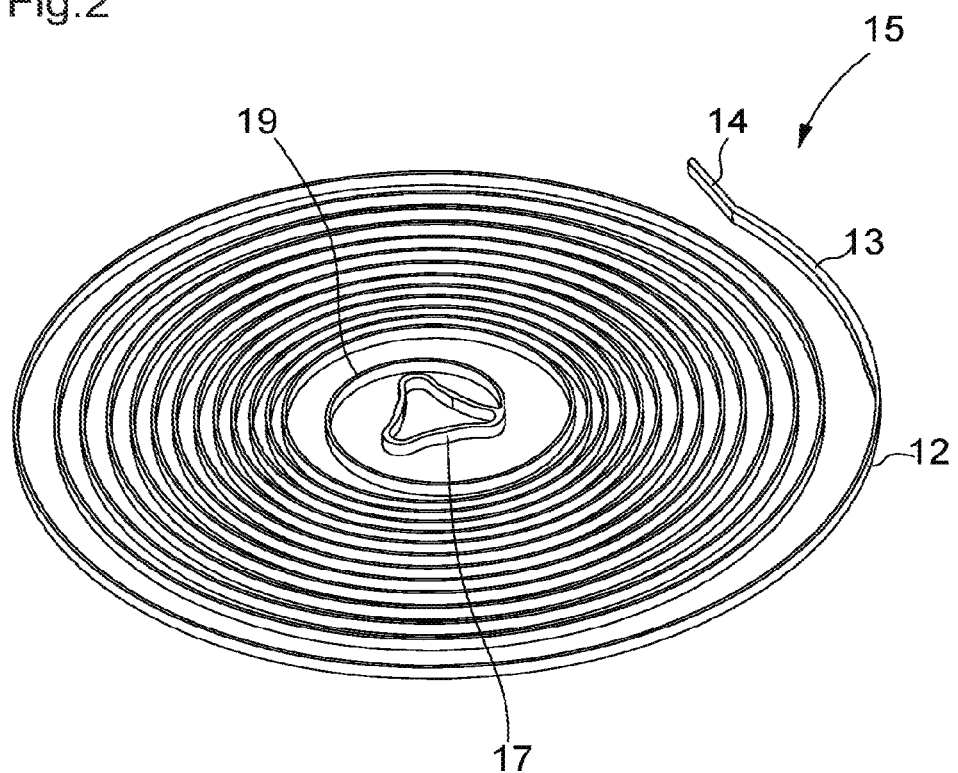
FIG. 2 is an example geometry of a balance spring according to the invention.

Advantageously according to the invention, it is thus possible, with no further complexity, to fabricate, as illustrated in FIG. 2, a balance spring 5c, 5, 15 comprising in particular:
- one or more coils of more precise cross-section(s) than that obtained by means of a single etch;
- variations in thickness and/or in pitch along the coil;
- a one-piece collet 17;
- an inner coil 19 of the Grossman curve type
- a one-piece balance spring stud attachment 14;
- a one-piece external attachment element;
- a portion 13 of the outer coil 12 that is thicker than the rest of the coils.

Finally, method 31 may also comprise step 45 intended to assemble a compensating balance spring 5, 15 obtained in step 41, or a balance spring 5c obtained in step 39, to a balance having a predetermined inertia obtained in step 43, to form a resonator 1 of the sprung balance type, which may or may not be temperature compensated, i.e. whose frequency f is or is not sensitive to temperature variations.

Of course, the present invention is not limited to the illustrated example but is capable of various variants and modifications that will appear to those skilled in the art. In particular, as explained above, the balance, even if it has an inertia predefined by design, may comprise movable inertia-blocks offering an adjustment parameter prior to or after the sale of the timepiece.

Further, an additional step could be provided, between step 39 and step 41, or between step 39 and step 45, for depositing a functional or aesthetic layer, such as, for example, a hardening layer or a luminescent layer.

It is also possible to envisage, when method 31 performs, after step 39, one or more iterations of steps 35, 37 and 39, that step 35 is not systematically implemented.

What is claimed is:

1. A method for fabrication of a balance spring of a predetermined stiffness, comprising the following steps:
   a) forming a balance spring in dimensions greater than dimensions necessary to obtain said balance spring of predetermined stiffness;
   b) determining a stiffness of the balance spring formed in step a) by measuring a frequency of said balance spring coupled with a balance having a predetermined inertia;
   c) calculating a thickness of material to be removed from said balance spring, based on the stiffness of the balance spring determined in step b), to obtain dimensions necessary to obtain said balance spring of predetermined stiffness; and
   d) removing, from the balance spring formed in step a), said thickness of the material in a non-homogeneous manner along the balance spring from a first face of said balance spring that is substantially perpendicular to a height dimension thereof and from another face of said balance spring that is substantially perpendicular to the first face, to obtain the balance spring having said dimensions necessary for said predetermined stiffness, said removing from the first face and from the another face being performed before the balance spring is assembled with a balance to form a resonator for a timepiece.

2. The fabrication method according to claim 1, wherein, the dimensions greater than said dimensions necessary to obtain the balance spring formed in step a) are oversized by between 1% and 20% than said dimensions necessary to obtain said balance spring of said predetermined stiffness after the removing of step d).

3. The fabrication method according to claim 1, wherein the forming of step a) is performed by a deep reactive ion etch.

4. The fabrication method according to claim 1, wherein the forming of step a) is performed by a chemical etch.

5. The fabrication method according to claim 1, wherein, in step a), several balance springs are formed in a same wafer in dimensions greater than the dimensions necessary to obtain several balance springs each being of a predetermined stiffness, or to obtain several balance springs of several predetermined stiffnesses.

6. The fabrication method according to claim 1, wherein the balance spring formed in step a) is silicon-based.

7. The fabrication method according to claim 1, wherein the balance spring formed in step a) is glass-based.

8. The fabrication method according to claim 1, wherein the balance spring formed in step a) is ceramic-based.

9. The fabrication method according to claim 1, wherein the balance spring formed in step a) is metal-based.

10. The fabrication method according to claim 1, wherein the balance spring formed in step a) is metal alloy-based.

11. The fabrication method according to claim 1, wherein the determining of step b) includes the following phases:
    b1) measuring a frequency of an assembly comprising the balance spring formed in step a) coupled to the balance having the predetermined inertia; and
    b2) deducing, from the measured frequency, a stiffness of the balance spring formed in step a).

12. The fabrication method according to claim 1, wherein the removing of step d) includes the following phase:
    d1) laser machining the balance spring formed in step a) to obtain the balance spring having the dimensions necessary for said predetermined stiffness.

13. The fabrication method according to claim 6, wherein the removing of step d) includes the following phases:
    d2) oxidising the balance spring formed in step a) in order to transform said thickness of silicon-based material to be removed into silicon dioxide, thereby forming an oxidised balance spring; and
    d3) removing oxide from the oxidised balance spring to obtain the balance spring having the dimensions necessary for said predetermined stiffness.

14. The fabrication method according to claim 1, wherein the removing of step d) includes the following phase:
    d4) chemically etching the balance spring formed in step a) to obtain the balance spring having the dimensions necessary for said predetermined stiffness.

15. The fabrication method according to claim 1, further comprising, after step d), performing, at least once more, steps b), c), and d) to improve dimensional quality of the balance spring.

16. The fabrication method according to claim 1, further comprising, after step d),
    e) forming, on at least one part of said balance spring of the predetermined stiffness, a portion for correcting a stiffness of the balance spring and for forming balance spring so that said balance spring is less sensitive to thermal variations.

17. The fabrication method according to claim 16, wherein the forming of step e) includes the following phase:
    e1) depositing a layer on one part of an external surface of said balance spring of the predetermined stiffness.

18. The fabrication method according to claim 16, wherein the forming of step e) includes the following phase:
    e2) modifying, to a predetermined depth, of one part of an external surface of said balance spring of the predetermined stiffness.

19. The fabrication method according to claim 16, wherein the forming of step e) includes the following phase:
    e3) modifying a composition, to a predetermined depth, of one part of an external surface of said balance spring of the predetermined stiffness.

20. The fabrication method according to claim 1, wherein in the removing of step d), said thickness of material is removed such that said balance spring of the predetermined stiffness produces a difference, due to a lack of concentricity of the development of the spring, in rate that is equal to or differs by a maximum of ±20% from a corresponding difference in rate produced by the balance spring formed in step a), said differences in rate each being measured at an oscillation amplitude of 150° and compared to an oscillation amplitude of 330°.

21. The fabrication method according to claim 1, wherein, in the removing of step d), said thickness of material is removed such that said balance spring of the predetermined stiffness produces a difference, due to a lack of concentricity of the development of the spring, in rate that is equal to or differs by a maximum of ±5 seconds/day from a corresponding difference in rate produced by the balance spring formed in step a), said differences in rate each being measured at an oscillation amplitude of 150° and compared to an oscillation amplitude of 330°.

22. The fabrication method according to claim 1, wherein, in the removing of step d), said thickness of material is removed from first discrete areas of the balance spring formed in step a), and is not removed from second discrete areas that alternate with the first discrete areas along the balance spring.

23. The fabrication method according to claim 22, wherein the first discrete areas have substantially a same angular size.

24. The fabrication method according to claim 22, wherein the first discrete areas are arranged substantially regularly along an entire length of said balance spring formed in step a).

25. The fabrication method according to claim 22, wherein the second discrete areas have substantially a same angular size.

26. The fabrication method according to claim 25, wherein the second discrete areas have substantially a same angular size as the first discrete areas.

27. The fabrication method according to claim 22, wherein the first discrete areas each have an angular size of 140° or less.

28. The fabrication method according to claim 1, wherein, in the removing of step d), said thickness of material is removed from the thickness of the balance spring formed in step a).

29. The fabrication method according to claim 22, wherein the first discrete areas each have an angular size comprised from 240° to 360°.

* * * * *